United States Patent
Yunogami et al.

(10) Patent No.: US 6,458,602 B1
(45) Date of Patent: Oct. 1, 2002

(54) METHOD FOR FABRICATING SEMICONDUCTOR INTEGRATED CIRCUIT DEVICE

(75) Inventors: Takashi Yunogami, Niiza (JP); Kenichi Shoji, Landshut (DE)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/889,855
(22) PCT Filed: Jan. 25, 2000
(86) PCT No.: PCT/JP00/00359
§ 371 (c)(1),
(2), (4) Date: Jul. 23, 2001
(87) PCT Pub. No.: WO00/45429
PCT Pub. Date: Aug. 3, 2000

(30) Foreign Application Priority Data

Jan. 26, 1999 (JP) .................................. 11-017298

(51) Int. Cl.[7] .............................................. H01L 21/00
(52) U.S. Cl. ............................................. 438/3; 438/727
(58) Field of Search ........................... 438/3, 689, 694, 438/706–744

(56) References Cited

FOREIGN PATENT DOCUMENTS

| JP | 7-169-751 | 7/1995 | |
|----|-----------|--------|---|
| JP | 9-237777 | 9/1997 | |
| JP | 10-247724 | 9/1998 | |
| JP | 410303295 A | * 11/1998 | ......... H01L/21/768 |
| JP | 11-3881 | 1/1999 | |

OTHER PUBLICATIONS

T. Asanae, "Foundation for SuperFine Fabrication", Mar. 25, 1993.

* cited by examiner

Primary Examiner—Craig Thompson
(74) Attorney, Agent, or Firm—Antonelli, Terry, Stout & Kraus, LLP

(57) ABSTRACT

According to the invention of the present application, for providing an etching technique for a wiring layer capable of decreasing the degradation of characteristics of a ferroelectric film in FeRAM, a wiring material (LI wiring 18, Al wiring 30) connected with an electrode layer of a ferroelectric film 11 (lower electrode 10, upper electrode 12) is fabricated by dry etching using inducely coupled plasma upon forming the wiring layer and, successively, applied with an asher treatment at a temperature of 300° C. or higher by using inducely coupled plasma while introducing a gas mixture, for example, of $O_2+CF_4+H_2O$.

20 Claims, 10 Drawing Sheets

METHOD FOR FABRICATING SEMICONDUCTOR INTEGRATED CIRCUIT DEVICE

TECHNICAL FIELD

This invention concerns a fabrication technique for a semiconductor integrated circuit device, and, it particularly relates to a technique effective for application to the dry etching technique for a wiring layer connected to a ferroelectric film or a highly dielectric film by way of an electrode layer.

BACKGROUND ART

Electron cyclotron resonance (ECR) plasma etching is one of dry etching techniques. This system has advantages in that high density plasmas (from $10^{11}$ to $10^{12}$ cm$^{-3}$) is provided and high speed etching can be carried out, the mean free process of ions is increased due to low voltage operation to align the directions of ions and obtain anisotropic shapes easily, accurate shape control is performed since ion energy can be controlled independently of plasma formation, metal contamination does not occur because of absence of the upper electrode, and that occurrence of obstacles is reduced in conjunction with the low voltage operation.

Accordingly, the ECR plasma etching has been introduced in the dry etching techniques for semiconductor integrated circuit devices that require fine fabrication and less dusting and adopted in various etching processes.

The ECR plasma etching apparatus described above are described, for example, in "Foundation for Superfine Fabrication", written by Tatsuo Asanae, p 74, FIG. 4.10(b), published from Nikkan Kogyo Shinbunsha, on Mar. 25, 1993.

DISCLOSURE OF THE INVENTION

However, for applying the ECR plasma etching to the fabrication steps of a wiring layer in FeRAM (Ferroelectric Random Access Memory), the present inventors have found the following problems.

That is, when a wiring layer, for example, a titanium nitride (TiN) film or an aluminum (Al) alloy film connected to a PZT (PbZrTiO$_3$) film by way of an electrode layer, for example, a platinum (Pt) film is fabricated by ECR plasma etching using a photoresist pattern as a mask and, successively, an asher treatment for removing the photoresist pattern is applied to a semiconductor wafer (generally, the dry etching treatment and the ashing treatment are conducted by one identical multi-chamber type apparatus by transferring a wafer to be fabricated from a dry etching treatment chamber to an ashing treatment chamber with no exposure to atmospheric air), apparent degradation was observed in the result of an acceleration test for the PZT characteristics, for example, amount of polarization $Q_{SW}$ (length of C-axis segment of a hysteresis characteristic curve for a ferroelectric capacitor on a CV plane, which corresponds, in principle, to amount of charges accumulated in a storage cell) (depolarization). That is, after patterning a TiN wiring, when accelerated degradation test was applied at 150° C. for 100 hrs, it was found that the characteristics were degraded to less than the lower limit of 5 $\mu$C/cm$^2$ for the amount of polarization required for the products in about 10 hrs, as to those fabricated by ECR plasma etching and applied with an ashing treatment in a low temperature region at a temperature on the back of wafer of about 50° C. to 60° C. (from 100 to 110° C. as the temperature on the upper surface of the wafer).

On the contrary, it has been found that those etched by inducely coupled plasma etching or those etched by ECR plasma etching and then subjected to the ashing treatment in a high temperature region, for example, at a temperature on the back of the wafer of 240° C., retained the amount of polarization more than the lower limit described above even after the accelerated test for 100 hrs (corresponding to continuous use for about 10 years).

Referring more specifically, those etched by the inducely coupled plasma etching and then subjected to the ashing treatment in a high temperature region, for example, at 240° C. for the temperature on the back of a wafer showed further preferred characteristics in the accelerated degradation test, and relatively preferred characteristics were shown by the plasma density in the inducely coupled plasma etching in the lower density area (from $1.0\times10^{10}$ to $1.0\times10^{11}$/cm$^3$). Further, it was found for the ashing gas that a preferred characteristic was shown by adding steams compared with a gas mainly comprising oxygen (or solely consisting of oxygen) and, further, a more preferred characteristic was shown by adding a fluorocarbon gas such as CF$_4$. Referring to the ashing temperature, in a case of PZT having a curie point Tc of about 450° C., the effect begins to develop at the temperature on the upper surface of the wafer of 150° C. (⅓ for Tc on the Celsius indication here and hereafter) or higher, it become rather remarkable at 200° C. (about 40% for Tc) or higher and a further remarkable effect is obtained at 300° C. (⅔ of Tc) or higher. In the system heating at the back of the wafer described above, in view of the temperature set to the wafer, that is, the temperature on the back of the wafer, it is a value obtained by subtracting about 50° C. from the temperature on each upper surface of the wafer.

The ashing temperature may be further nearer to the curie point or higher in view of the temperature on the upper surface of the wafer. If there are no other problems, it may be considered theoretically that as the temperature is higher crystals restore more remarkably. Naturally, it should be lower than the melting point of inter-wiring materials (660° C. in a case of aluminum).

It is considered that since ECR plasma etching has a plasma generation mechanism accompanied with strong magnetic fields, charge up damages or UV ray-induced damages are increased by poor uniformity of plasmas.

On the other hand, in a case of the inducely coupled plasma (hereinafter simply referred to as ICP), it is considered that the damages are decreased since relatively uniform plasmas are formed on the wafer. ICP is classified as a sort of plasma furnaces of accelerating electrons by induction coupling to conduct plasma excitation by applying an RF power (for example at 13.56 MHz) to coils or stripe-like or coiled antennas, and it does not accompany as a rule relatively strong magnetic fields for plasma excitation on the wafer to be treated in most cases (this also contributes to the uniformity of plasmas at the periphery of the wafer). It has a feature capable of attaining a uniform plasma distribution relatively simply by devising the shape and the arrangement of coils. Further, it is considered that recovery of perovskite crystals (PZT, BST, etc) proceeds more smoothly as the ashing temperature is higher.

While identical preferred damage characteristics may be obtained also by reactive ion etching such as capacitively coupled plasma (parallel plate type), reactive ion etching apparatus available at present involve a problem regarding other characteristics required for metal etching and they can not be applied at present, but leave a room for application if other characteristics are satisfied.

Further, for DRAM, when a perovskite type highly dielectric material such as BST is intended to be formed into a capacitor insulative film, it is considered that identical preferred damage characteristics can be obtained by etching by the inducely coupled plasma and an ashing treatment at a relatively high temperature. That is, the dielectric constant of the capacitor insulative film shows no abrupt degradation (lowering of the dielectric constant in this case) even by the same accelerated test. In this ashing, what corresponds to the curie point Tc described previously is a crystallizing annealing temperature Tcr conducted after forming the capacitor insulative film by CVD or the like (heat treatment temperature for converting from amorphous to crystalline film), which is at 700° C. to 800° C. in a case of BST. Accordingly, the effect begins to develop at about 250° C. for the temperature on the upper surface of the wafer (200° C. for the temperature on the lower surface of a wafer), the effect becomes rather conspicuous at 330° C. (280° C. for the temperature on the lower surface of the wafer) or higher and the effect becomes more remarkable at 500° C. (450° C. for the temperature on the lower surface of the wafer) or higher.

An object of this invention is to provide an etching technique for a wiring layer capable of decreasing the degradation characteristics in a ferroelectric film in FeRAM.

Other objects and novel features of this invention will become apparent by referring to the descriptions of this specification and appended drawings.

Among the inventions disclosed in this application, outline for typical ones will be explained simply as below.

(1) In a method for fabricating a semiconductor integrated circuit device according to this invention, when a wiring layer to be connected to a ferroelectric film having a perovskite structure by way of an electrode layer, a wiring material deposited on a semiconductor substrate is at first fabricated by dry etching using inducely coupled plasma and then an asher treatment is conducted by using inducely coupled plasma of introducing a gas mixture of $O_2+CF_4+H_2O$ at a temperature in the upper surface of a semiconductor substrate, for example, of 300° C. or higher.

(2) In a method for fabricating a semiconductor integrated circuit device according to this invention, the plasma density of the inducely coupled plasma is $1.0 \times 10^{10}$ to $1.0 \times 10^{11}$ cm$^{-3}$ in the method of fabricating the semiconductor integrated circuit device as defined in (1) above. It is of course possible also in a higher density region.

(3) In a method for fabricating a semiconductor integrated circuit device according to this invention, the wiring material comprises a titanium nitride film or an aluminum alloy film in the method for fabricating the semiconductor integrated circuit device as defined in (1) above.

(4) In a method for fabricating a semiconductor integrated circuit device according to this invention, the ferroelectric film comprises a $PbZrTiO_3$ film or a $PbLaZrTiO_3$ (simply referred to as PlZt) film in the method for fabricating the semiconductor integrated circuit device as defined in (1) above.

In the means described above, since dry etching by low density plasmas using the inducely coupled plasma is adopted when the wiring layer connected to the ferroelectric film by way of the electrode layer is formed and plasmas of good uniformity can be obtained, uniformity of charges flying to the semiconductor wafer is improved and, further, charge up damages are decreased do to the absence of magnetic fields on the semiconductor wafer.

Further, the ahser treatment using the inducely coupled plasma is conducted by setting the temperature on the upper surface of the semiconductor wafer to, for example, 300° C. or higher and introducing the gas mixture of $O_2+CF_4+H_2O$, crystals of the ferroelectric film are re-arranged and damages of the ferroelectric film caused by dry etching using the inducely coupled plasma can be recovered.

Other outlines of the invention according to the present application will be simply summarized as below for each of the items.

(1). A method for fabricating a semiconductor integrated circuit device for forming a wiring layer to be connected to a dielectric film by way of an electrode layer, wherein a wiring material deposited on a semiconductor substrate is fabricated by dry etching using inducely coupled plasma and then an asher treatment is conducted using inducely coupled plasma of introducing a gas mixture to which an $H_2O$ gas is added at a temperature on the upper surface of the semiconductor substrate, for example of 300° C. or higher.

(2). A method for fabricating a semiconductor integrated circuit device as defined in (1) above, wherein the gas mixture is a gas mixture comprising $O_2+CF_4+H_2O$.

(3). A method for fabricating a semiconductor integrated circuit device as defined in (1) above, wherein a plasma density in the inducely coupled plasmas is from $1.0 \times 10^{10}$ to $1.0 \times 10^{11}$ cm$^{-3}$.

(4). A method for fabricating a semiconductor integrated circuit device as defined in (1) above, wherein the wiring layer is formed as a partial wiring and a wiring layer to be connected with the partial wiring is included.

(5). A method for fabricating a semiconductor integrated circuit device as defined in (1) above, wherein the wiring material comprises a titanium nitride film or an aluminum alloy film.

(6). A method for fabricating a semiconductor integrated circuit device as defined in (1) above, wherein the dielectric film comprises a ferroelectric film or a highly dielectric film having a perovskite structure.

(7). A method for fabricating a semiconductor integrated circuit device as defined in (6) above, wherein the ferroelectric material comprises a $PbZrTiO_3$ film or a PbLaZrTiO3 film, and the highly dielectric film comprises a BaSrTiO$_3$ (simply referred to as BST) film.

BRIEF DESCRIPTION OF THE ACCOMPANYING DRAWINGS

BEST MODE FOR PRACTICING THE INVENTION

Figure 1:
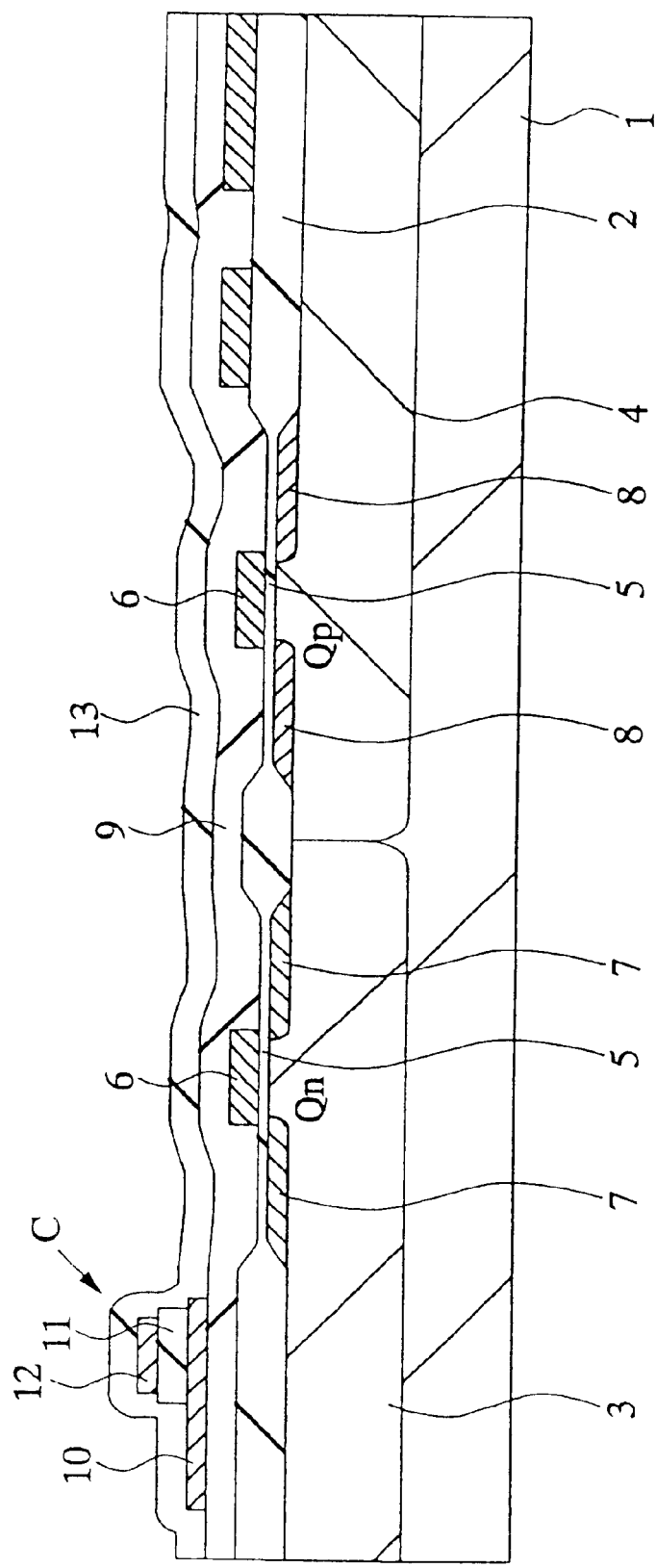
FIG. 1 is a cross sectional view for a principal portion of a semiconductor substrate showing a method for fabricating an FeRAM applied with dry etching as an embodiment according to this invention.

Preferred embodiments according to this innovation are to be described specifically with reference to the drawings.

Throughout, the drawings for explaining the preferred embodiments those having identical functions carry the same reference numerals, for which duplicate descriptions will be omitted.

A method for fabricating FeRaM applied with the dry etching technique as one embodiment according to this invention is to be explained with reference to FIG. 1 to FIG. 9. In the drawings, are shown a ferroelectric capacitor C formed as a memory array, and an n channel type MISFET (metal insulator semiconductor field effect transistor) Qn and p channel type MISFET Qp.

At first, as shown in FIG. 1, a field insulative film 2 for device isolation is formed on the main surface of a non-active region of a p-type semiconductor substrate 1 of about 10 Ωcm. Then, a p-type impurity, for example, boron (B) is ion implanted to a region forming the n channel type MISFET Qn to form a p-type well 3, and n-type impurity, for example, phosphorus (P) is ion implanted to a region for forming the p channel type MISFET Qp to form an n-type well 4 in a well-known method.

Then, although not illustrated, for controlling the threshold voltage of the n channel type MISFET Qn and p channel type MISFET Qn, an impurity, for example, B or boron fluoride ($BF_2$) is ion implanted into the p-type well 3 and the n-type well 4.

Then, after forming a clean gate insulative film 5 by using a hydrogen combustion method to each surface of the p-type well 3 and the n-type well 4, a polycrystal silicon film is deposited by a chemical vapor deposition (CVD) method on the semiconductor substrate 1 and then the polycrystal silicon film is fabricated by using a photoresist pattern as a mask to thereby form a gate electrode 6 comprising the polycrystal silicon film.

Subsequently, by ion implanting an n-type impurity, for example, arsenic (As) or P to the p-type well 3 using a photoresist pattern as a mask, an n-type semiconductor region 7 constituting source and drain of the n-channel type MISFET Qn is formed. In the same manner, by ion implanting a p-type impurity, for example, B or $BF_2$ to the n-type well 4 using a photoresist pattern as a mask, a p-type semiconductor region 8 constituting source and drain of the p-type channel type MISFET Qp is formed.

Then, after depositing an insulative film 9 over the entire surface of the semiconductor substrate 1 by a CVD method, a platinum (Pt) film constituting one of electrode plates of a ferroelectric capacitor C is deposited over the entire surface of the semiconductor substrate 1 and then the Pt film is fabricated using a photoresist pattern as a mask to form a lower electrode layer 10 comprising the Pt film.

Then, after depositing a ferroelectric film 11 as a ferroelectric material for the ferroelectric capacitor C over the entire surface of the semiconductor substrate 1, the ferroelectric film 11 is fabricated using a photoresist pattern as a mask. The ferroelectric film 11 is, for example, a PZT film. The PZT film is formed, for example, by a sputtering method, an MOCVD (Metal Organic Chemical Vapor Deposition) method, a laser abrasion method or a spin-on coating method to a film thickness, for example, of about 300 nm.

Successively, a platinum (Pt) film constituting the other electrode plate of the ferroelectric capacitor C is deposited over the entire surface of the semiconductor substrate 1 and then the Pt film is fabricated by using a photoresist pattern as a mask to form an upper electrode layer 12 comprising the Pt film. Thus a ferroelectric capacitor C having the lower electrode layer 10 as one electrode plate, the upper electrode layer 12 as the other electrode plate and the ferroelectric film 11 situated between the lower electrode layer 10 and the upper electrode 12 as a ferroelectric material is completed.

Subsequently, an interlayer insulative film 13 comprising a silicon oxide film is formed over the entire surface of the semiconductor substrate 1.

Figure 2:
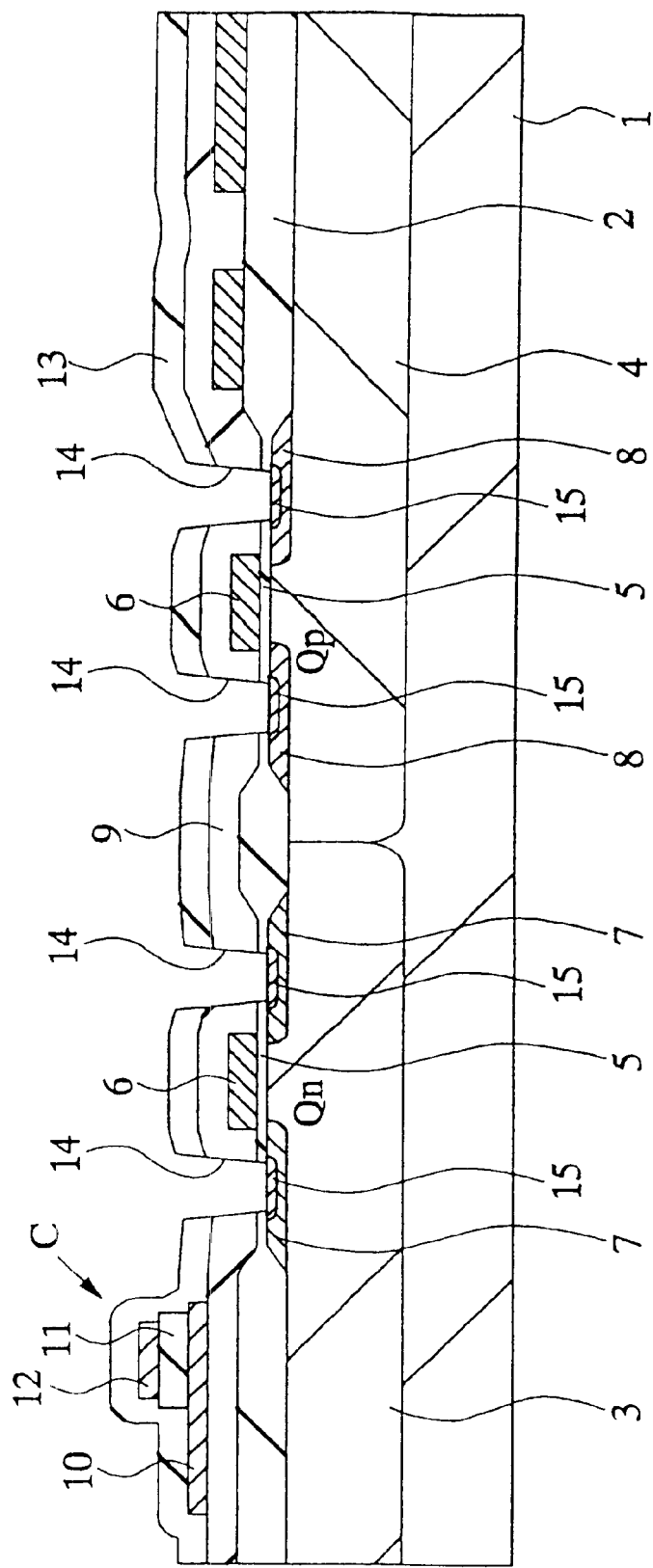
FIG. 2 is a cross sectional view for a principal portion of a semiconductor substrate showing a method for fabricating an FeRAM applied with dry etching as an embodiment according to this invention.

Then, as shown in FIG. 2, insulative films identical with the interlayer insulative film 13, the insulative film 9 and the gate insulative film 5 are fabricated successively using a photoresist pattern formed on the insulative film as a mask. This forms contact holes 14 reaching the n type semiconductor region 7 constituting the source and the drain of the n-channel type MISFET Qn and the p-type semiconductor region 8 constituting the source and the drain of the p-channel type MISFET Qp.

Then, after depositing a Pt film over the entire surface of the semiconductor substrate 1, heat treatment is applied to the semiconductor substrate 1 and then unreacted Pt film is removed to form a platinum silicide (PtSi) film 15 of low resistance to the surface of n-type semiconductor region 7 constituting the source and the drawing of the n-channel type MISFET Qn and to the surface of the p-type semiconductor region 8 constituting the surface and the drawn of the p-channel type MISFET Qp.

Figure 3:
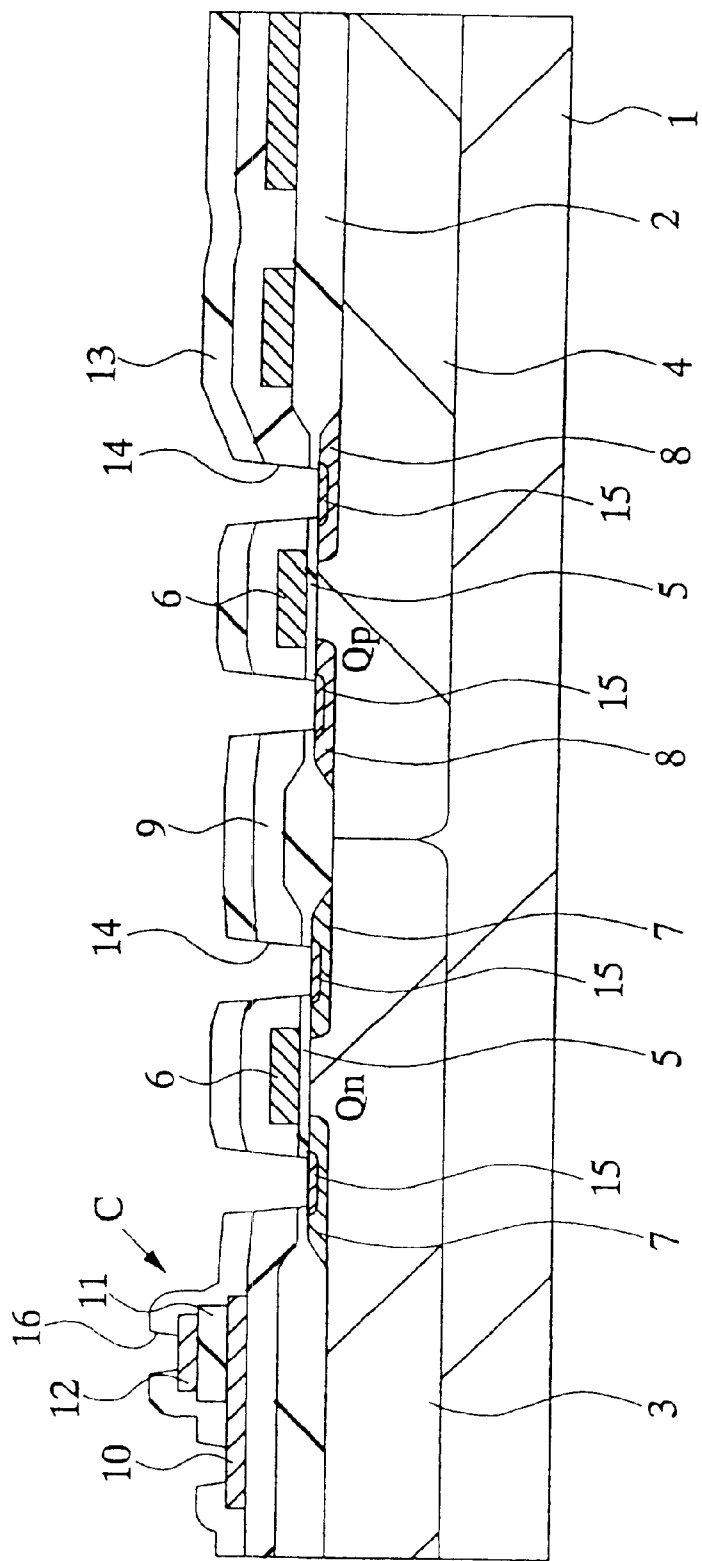
FIG. 3 is a cross sectional view for a principal portion of a semiconductor substrate showing a method for fabricating an FeRAM applied with dry etching as an embodiment according to this invention.

Then, as shown in FIG. 3, the interlayer insulative film 13 or fabricated by using a photoresist pattern as a mask to form a contact hole 16 reaching the lower electrode layer 10 and the upper electrode layer 12.

Figure 4:
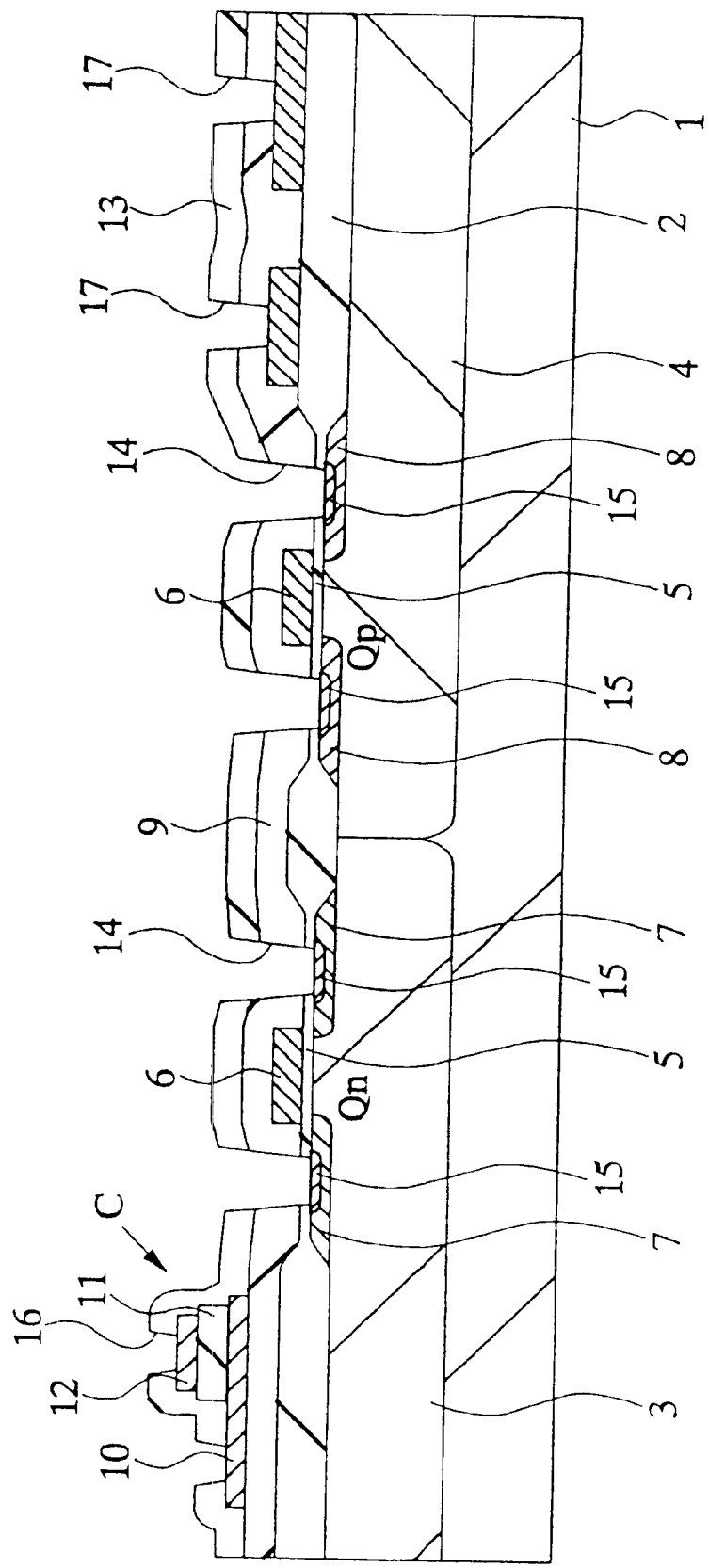
FIG. 4 is a cross sectional view for a principal portion of a semiconductor substrate showing a method for fabricating an FeRAM applied with dry etching as an embodiment according to this invention.

Then, as shown in FIG. 4, the interlayer insulative film 13 and the insulative film 9 are fabricated successively using a photoresist pattern as a mask to form contact holes 17 reaching the polycrystal silicon film constituting the gate electrode 6 of the n-channel type MISFET Qn and the p channel type MISFET Qp.

Figure 5:
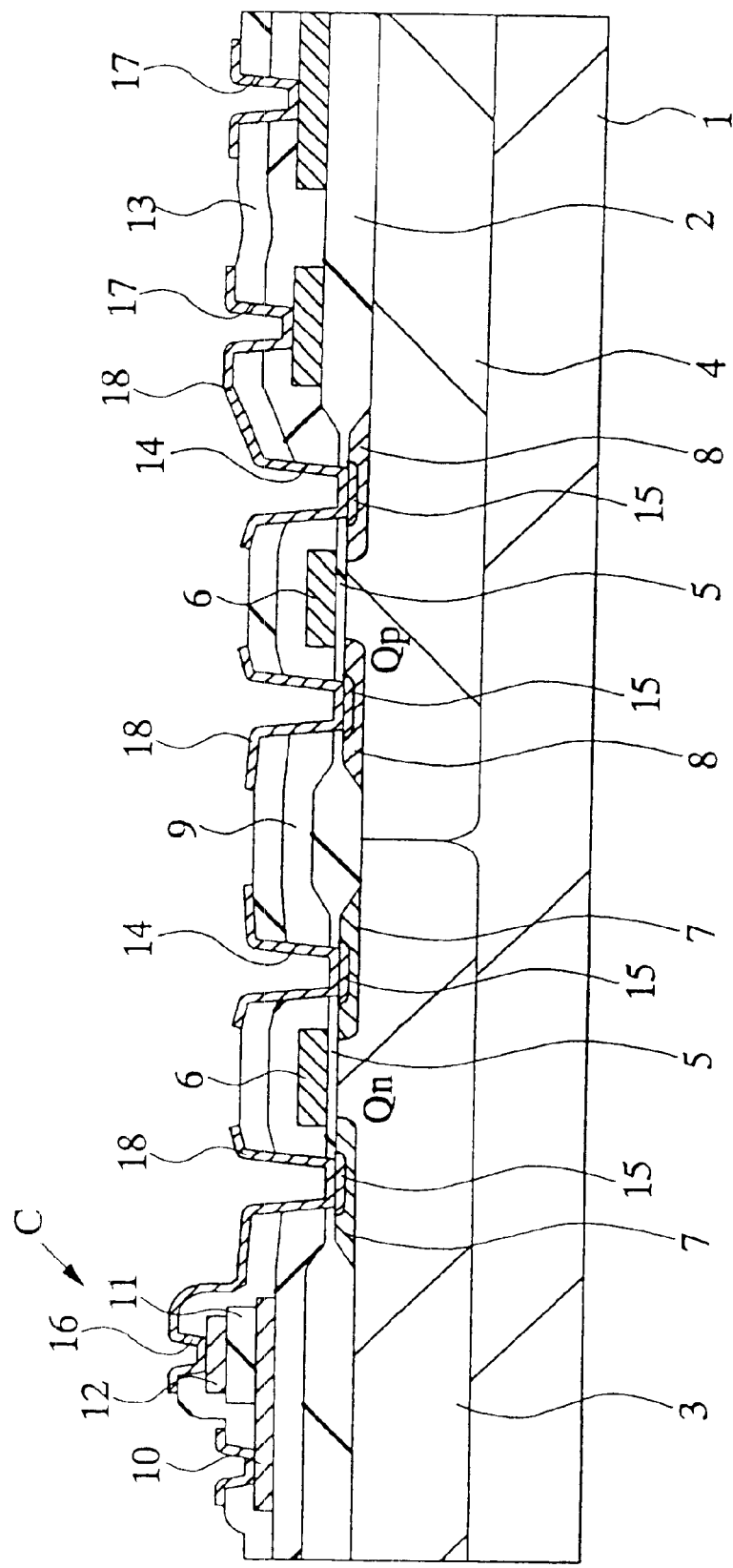
FIG. 5 is a cross sectional view for a principal portion of a semiconductor substrate showing a method for fabricating an FeRAM applied with dry etching as an embodiment according to this invention.

Then, as shown in FIG. 5, after depositing a titanium nitride (TiN) film over the entire surface of the semiconductor substrate 1, the TiN film is fabricated by dry etching using a photoresist pattern as a mask to form an LI (local interconnect wiring) 18.

Figure 6:
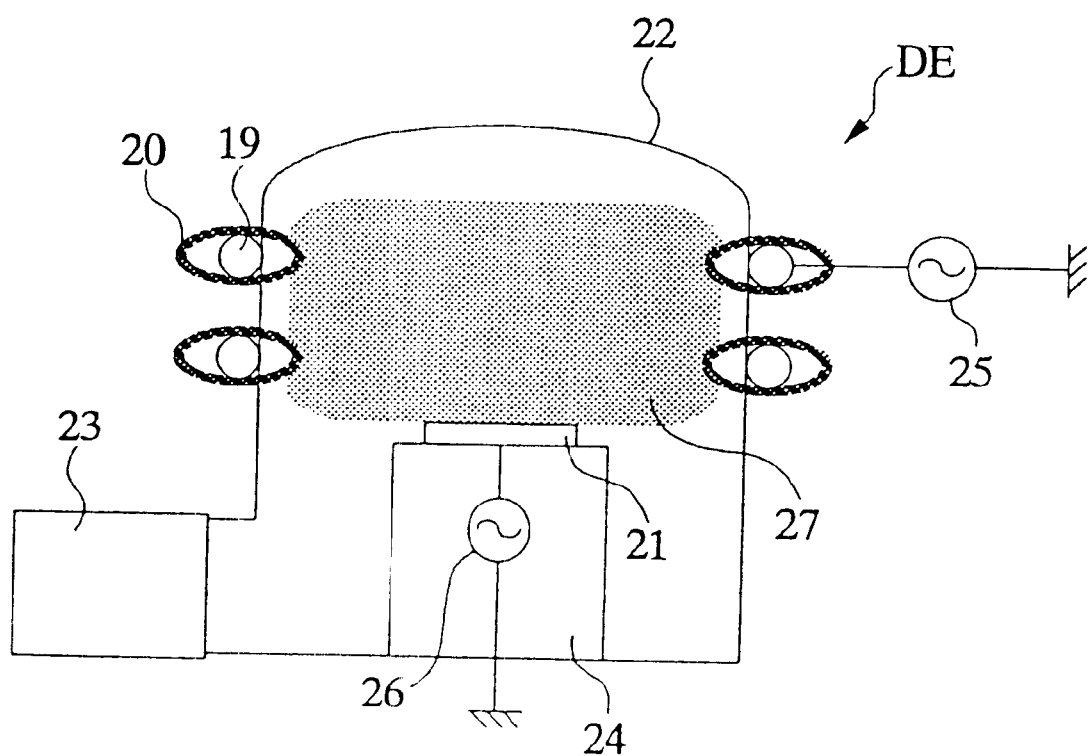
FIG. 6 is a cross sectional view for a principal portion showing a schematic view of an ICP etching apparatus used in an embodiment according to this invention.

In this case, inducely coupled plasma (ICP) as one of the methods of generating plasmas under the absence of magnetic fields is applied as the dry etching. FIG. 6 shows a schematic view for a principal portion of an ICP etching apparatus DE. There are shown coils 19, magnetic fields 20, a semiconductor wafer 21, a quartz discharge tube 22, a vacuum pump 23, a specimen table 24, an ICP power source (13.56 MHz) 25, an RF power source (13.6 MHz) 26 and generated plasmas 27 (shown by hatched area in the drawing).

In the ICP etching apparatus DE described above, the plasmas 27 can be generated by the magnetic fields 20 induced to the coils 19 to provide uniform plasmas of low density to high density of $10^{10}$ to $10^{12}$ cm$^3$. In this embodiment, low density plasmas of about $10^{10}$ to $10^{11}$ cm$^3$ are adopted. Since this can provide plasmas of good uniformity, the uniformity of charges flying to the semiconductor wafer 21 is improved, and charge up damages are reduced since there are no magnetic fields on the semiconductor wafer 21.

Dry etching for the TiN film is conducted by using, for example, a gas mixture of $BCl_3+Cl_2$ under the condition, at a gas pressure of 12 mTorr, at an ICP power of 150 to 400 W and at an rf power of 150 to 200 W.

Then, an asher treatment using inducely coupled plasma and a water washing treatment are conducted successively. This removes the photoresist pattern as a mask upon dry etching of the TiN film. In the asher treatment, a gas mixture of $O_2+CF_4+H_2O$ is used as an introduced gas and the temperature for the semiconductor wafer is set to 300° C. or higher. The curie point of PZT is 450° C. and when heat at 300° C. or higher which is near the temperature of 450° C. is applied, crystals are re-arranged to recover damages of the ferroelectric film 11 caused by dry etching. Further, the asher treatment is conducted under the conditions, for example, at a gas pressure of 700 mTorr (93.3254 Pa) and at an ICP power of 1000 W.

A barrier layer may be disposed between the ferroelectric film 11 and the lower electrode 10 for preventing reaction between both of them, and in the same manner, the barrier layer may also be disposed between the ferroelectric film 11 and the upper electrode 12.

Figure 7:
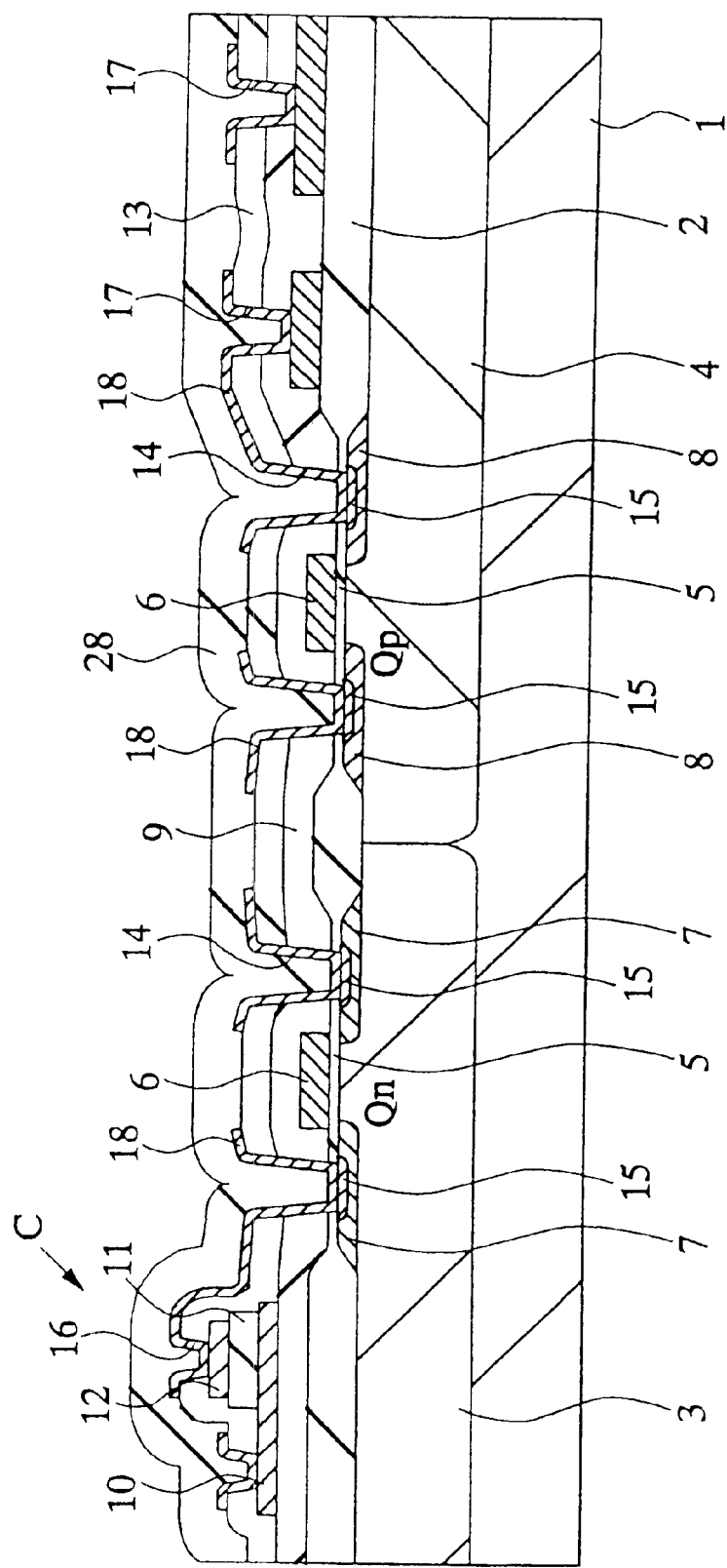
FIG. 7 is a cross sectional view for a principal portion of a semiconductor substrate showing a method for fabricating an FeRAM applied with dry etching as an embodiment according to this invention.

Then, as shown in FIG. 7, after forming a TEOS film over the entire surface of the semiconductor substrate 1 by a plasma CDV method using tetraethoxy silane (Tetra Ethyl Ortho Silicate) $Si(OC_2H_5)_4$: TEOS) and ozone ($O_3$) as a source, an SOG (Spin On Glass) film is formed by a rotary coating method and, successively, a TEOS film is formed by a plasma CVD method using TEOS and $O_2$ as a source to form an interlayer insulative film 28 of a three layered structure comprising a TEOS film, an SOG film and a TEOS film.

Figure 8:
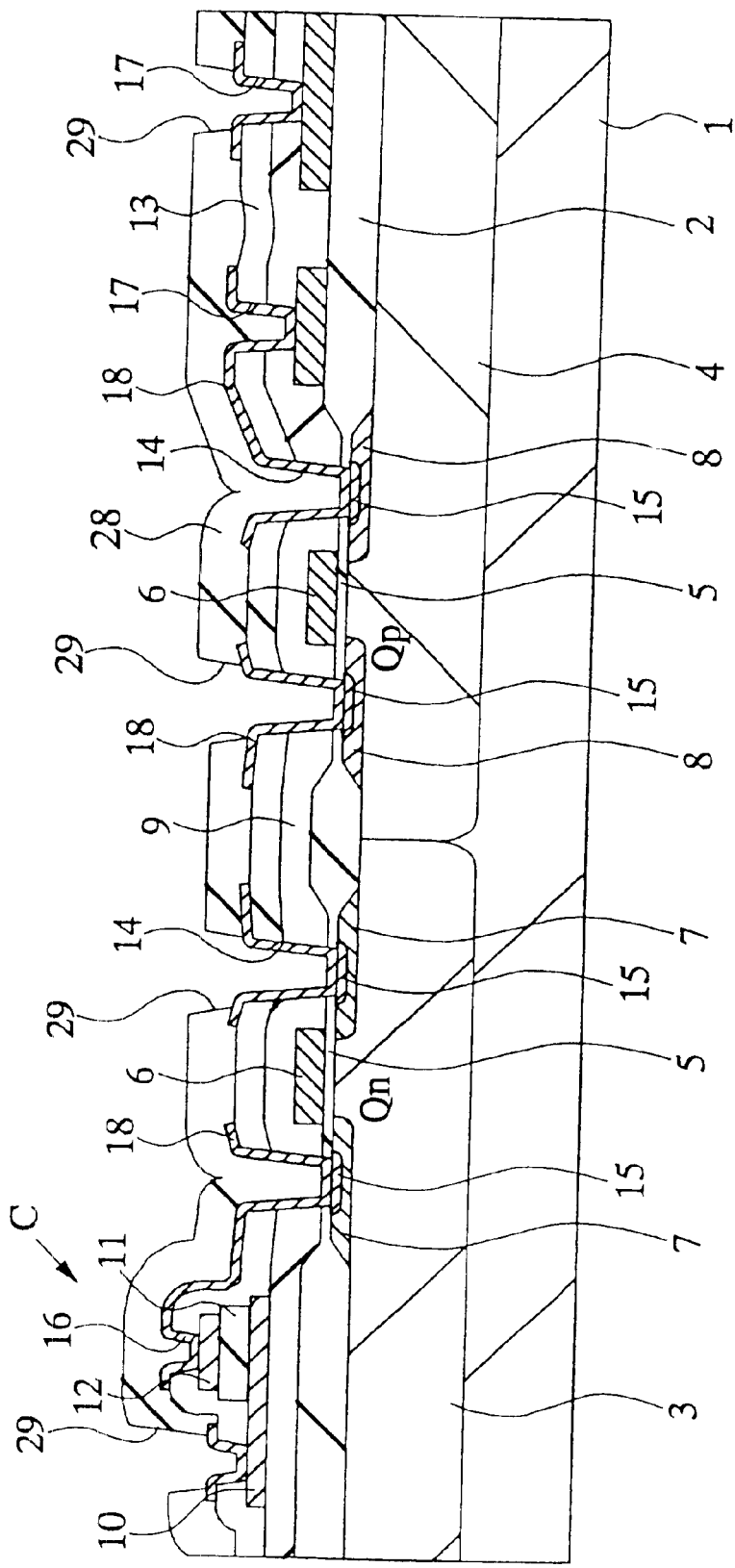
FIG. 8 is a cross sectional view for a principal portion of a semiconductor substrate showing a method for fabricating an FeRAM applied with dry etching as an embodiment according to this invention.

Then, as shown in FIG. 8, the interlayer insulative film 28 is fabricated by using a photoresist pattern as a mask to form contact holes 29 leaching the LI wirings 18.

Figure 9:
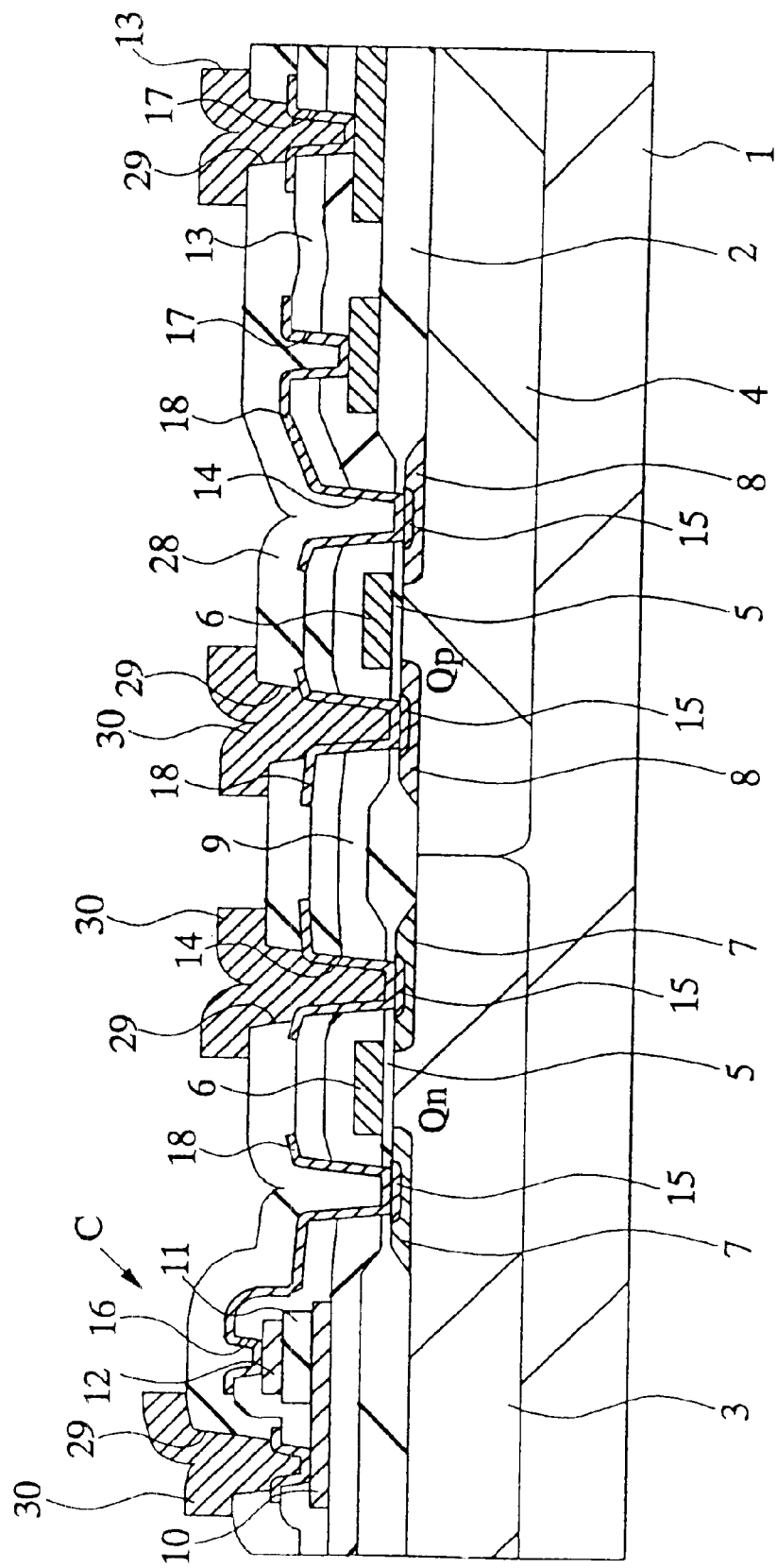
FIG. 9 is a cross sectional view for a principal portion of a semiconductor substrate showing a method for fabricating an FeRAM applied with dry etching as an embodiment according to this invention.

Then, as shown in FIG. 9, after depositing an aluminum (Al) alloy film over the entire surface of the semiconductor substrate 1, the Al alloy film is fabricated by dry etching using a photoresist pattern as a mask to form an Al wiring 30.

In the dry etching for the Al alloy film, the inducely coupled plasma adopted upon fabricating the LI wiring 18 is used. That is, the Al alloy film is fabricated by low density plasmas of good uniformity using the ICP etching apparatus shown in FIG. 6. Thus, uniformity of charges flying to the semiconductor wafer 21 is improved by plasmas of good uniformity and, since there are no magnetic fields on the semiconductor wafer 21, charge up damages can be reduced.

Dry etching for the Al alloy film is conducted by using, for example, a gas mixture of $BCl_3+Cl_2$ under the conditions at a gas pressure of 12 mTorr (1.59986 Pa), at an ICP power of 150 to 400 W and at an rf power of 150 to 200 W.

Then, an asher treatment using the inducely coupled plasma and a water washing treatment are conducted successively. This removes the photoresist pattern used as the mask upon drying etching of the Al alloy film. In the asher treatment, a gas mixture comprising $O_2+CF_4+H_2O$ is used as an introduced gas and the temperature of the semiconductor wafer is set to 300° C. or higher. The curie temperature of PZT is 450° and when heat at 300° or higher which is near the temperature of 450° C. is applied, crystals are re-arranged and damages of the ferroelectric film 11 caused by the dry etching are recovered. Further, the asher treatment is conducted under the conditions, for example, at a gas pressure of 700 mTorr and at an ICP power of 1000 W.

Since it is considered that the effect of the crystal re-arrangement generally develops at a temperature about ⅓ of the curie point, in a case of PZT, for instance, it is considered the effect of the recrystal rearrangement begins to develop at 150° C. or higher, which becomes considerably remarkable at 200° C. or higher and the effect is further remarkable at a temperature exceeding about ⅔ of the curie point, that is, at 300° C. or higher.

As described above according to this embodiment, damages to the ferroelectric film 11 caused upon dry etching are reduced by fabricating the LI wirings 18 and the Al wiring 30 connected by way of the upper electrode 12 or the lower electrode 10 to the ferroelectric film 11 by dry etching using the inducely coupled plasma for generating plasmas with no magnetic fields, and then the damages to the ferroelectric film caused by the dry etching are further recovered by re-arrangement of the crystals of ferroelectric film 11 caused by the asher treatment using the inducely coupled plasma applied to the semiconductor wafer 21.

Further, this embodiment is applied to FeRAM using the PZT film for the ferroelectric material of the ferroelectric capacitor but it is also applied to FeRAM using a material forming spontaneous polarization with no application of electric fields, for example, a ferroelectric film having a perovskite structure such as a PLZT ($PbLaZrTiO_3$) film to obtain an identical effect.

They are of course applicable also to perovskite structure dielectric materials in general. Accordingly, it is also applicable, for example, to Aurivillius compounds including layered perovskite, Y1 series perovskite and bismuth-containing pseudo perovskite.

Further, it is also applicable to DRAM using, for example, a BST ($BaSrTiO_3$) film having a perovskite structure and using a highly dielectric material with a specific dielectric constant of about 200 to 500 for a information storing capacitance element of a memory cell.

Figure 10:
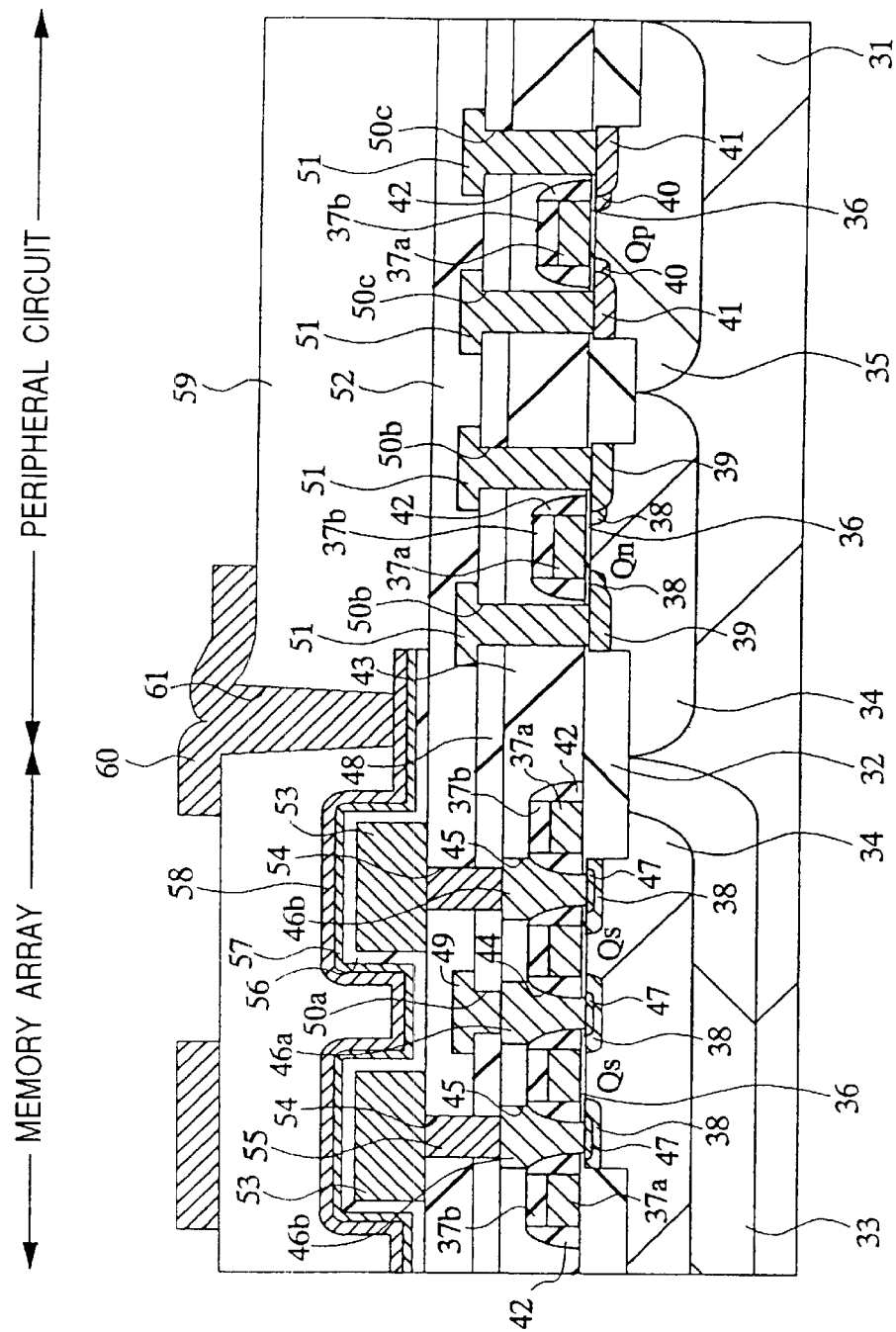
FIG. 10 is a cross sectional view for a principal portion of a semiconductor substrate showing a DRAM manufactured by applying dry etching as an embodiment according to this invention.

FIG. 10 shows a cross sectional view for a principal portion of DRAM having a memory cell comprising information storing capacitance devices constituted by putting a capacitive insulative film comprising a BST film between a storing electrode comprising an Ru or $RuO_2$ from and a plate electrode comprising an $RuO_2$ film.

Qs is a memory cell selecting MISFET formed into a memory array and Qn and Qp are n channel type MISFET and p channel type MISFET formed in a peripheral circuit.

As shown in FIG. 10, a trench type device isolation insulative film 32 is formed in a device isolation region on a main surface of a semiconductor substrate 31 comprising silicon single crystals and, further, an n type buried well 33 is formed to a deep portion of a semiconductor substrate 31 of a memory cell forming region (memory array), a p-type well 34 is formed to a portion of a peripheral circuit of the memory array (region for forming the n channel type MISFET Qn) and an n-type well 35 is formed to other portion of the peripheral circuit (region for forming the p-channel type MISFET Qp).

The memory cell selecting MISFET Qs comprises a gate insulative film 36, a gate electrode 37A constituted with a silicon oxide film and a pair of n type semiconductor regions 38 constituting the source and the drain, and the gate electrode 37a is constituted integrally with a word line for selecting the memory cell.

The n cannel type MISFET Qn comprises a gate insulative film 36, a gate electrode 37a and a pair of $n^-$ type semiconductor regions 38 and a pair of $n^+$ type semiconductor regions 39 constituting source and the drain, while the p channel type MISFET Qp comprises a gate insulative film 36, a gate electrode 37a and a pair of $p^-$ type semiconductor regions 40 and a pair of $p^+$ type semiconductor regions 41 constituting the source and the drain.

The gate electrode 37a comprises a polycrystal silicon film introduced with the n type impurity and a tungsten silicide film is formed above the polycrystal silicon film for reducing the resistance value. A silicon nitride film 37b is formed to the upper layer of the gate electrode 37a and, further, a side wall spacer 42 constituted with a silicon nitride film is formed to the lateral wall in the longitudinal direction of the gate.

An interlayer insulative film 43 constituted with a silicon oxide film is formed on the silicon nitride film 37b and the side wall spacer 42. Contact holes 44 and 45 are formed in the insulative films identical with the interlayer insulative film 43 on the $n^-$ type semiconductor region 38 constituting the source and the drain of the memory selecting MISFET Qs and the gate insulative film 35, and plugs 46a and 46b constituted with a polycrystal silicon film incorporated with an n type impurity are buried, respectively, to the contact holes 44 and 45.

Further, by the diffusion of the n type impurity from the bottom of the contact holes 44 and 45 to the $n^-$ type semiconductor region 38 constituting the source and the drain of the memory cell selecting MISFET Qs, an $n^+$ semiconductor region 47 is formed above the $n^-$ type semiconductor region 38.

A silicon oxide film 48 is formed above the interlayer insulative film 43. Further, a data line 49 constituted with a polycrystal silicon film incorporated with an n type impurity is formed above the silicon oxide film 48.

The data line 49 is connected by way of a contact hole 50a formed in the silicon oxide film 48 with the plug 46a and, further, connected by way of the plug 46a to one of the $n^-$ type semiconductor regions 38 constituting the source and the drain of the memory cell selecting MISFET Qs.

Further, a first layer wiring 51 for the peripheral circuit is constituted with a polycrystal silicon film identical with the layer of the data line 49 and the first layer wiring 51 is connected through contact holes 50b and 50c formed in the insulative films identical with the silicon oxide film 48, the interlayer insulative film 43 and the gate insulative film 36 with the $n^+$ type semiconductor region 39 of the n channel type MISFET Qn and the $p^+$ type semiconductor region 41 of the p channel type MISFET Qp, respectively.

An interlayer insulative film 52 is formed above the data line 49. Further, a storage electrode 53 for an information storage capacitance device is formed above the interlayer film 52, and the storage electrode 53 comprises a highly oxidation resistant material, for example, a ruthenium (Ru) film or a ruthenium oxide ($RuO_2$) film.

The storage electrode 53 is connected by way of a barrier metal 55 buried in the inside of a through hole 54 formed in the interlayer insulative film 52 and the silicon oxide film 48 and further connected by way of the plug 46b to the other of the $n^-$ type semiconductor regions 38 constituting the source and the drain of the memory cell selecting MISFET Qs.

The capacitive insulative film 56 is covered on the surface of the storage electrode 53 and, further, a plate electrode 57 is covered on the surface thereof. The capacitance insulative film 56 comprises, for example, a BST film. Further, the plate electrode 57 comprises, for example, an Ru film or an $RuO_2$ film and is formed so as to cover a plurality of storage electrodes 53.

Further, a barrier metal 58 is coated on the surface of the plate electrode 57 and an interlayer insulative film 59 is formed above the barrier metal 58. A second layer wiring 60 is formed above the interlayer insulative film 59, and the second layer wiring 60 is connected through a through hole 61 formed in the interlayer insulative film 59 to the barrier metal 58.

The second layer wiring 60 is formed by fabricating a metal film, for example, an Al alloy film deposited over the entire surface of the semiconductor substrate 31 by dry etching using a photoresist pattern as a mask. In the dry etching step and the succeeding asher removing step, the dry etching and the asher treatment using the inducely coupled plasma as the preferred embodiment of this invention can be applied to reduce damages on the capacitive insulative film 56.

Subsequently, an upper wiring layer is formed and a passivation film is formed at the uppermost layer although they are not illustrated.

The invention made by the present inventors has been described concretely based on the preferred embodiment of the invention but this invention is not restricted only to the embodiment described above but may be modified variously within a range not departing the gist thereof.

Industrial Applicability

Effects obtained by typical inventions among those described in this application will be explained simply as below.

According to this invention, since the wiring layer connected to the ferroelectric film by way of the electrode layer is formed by fabrication by the dry etching and the asher treatment using the inducely coupled plasmas, damages caused to the ferroelectric film can be reduced and degradation of the characteristics of the ferroelectric film of FeRAM can be suppressed.

What is claimed is:

1. A method for fabricating a semiconductor integrated circuit device comprising the steps of:

(a) forming a first dielectric film comprising a highly dielectric material or a ferroelectric material having a perovskite structure on a first main surface of a substrate for use in fabrication of an integrated circuit;

(b) forming a first conductive layer on the first main surface of the substrate on which the first dielectric film is formed;

(c) forming a first photoresist film pattern on the first main surface of the substrate on which the first conductive layer is formed;

(d) forming a first wiring pattern on the first main surface of the substrate by applying a dry etching treatment by inducely coupled plasma excitation to the first main surface of the substrate on which the first photoresist film pattern is formed; and (e) removing the first photoresist film pattern on the first main surface of the substrate by applying an ashing treatment to the first main surface of the substrate on which the first wiring pattern is formed.

2. A method of fabricating a semiconductor integrated circuit device according to claim 1, wherein the ashing treatment is conducted at a temperature on the upper surface of the substrate of 1/3 or higher for the curie point or the crystallizing annealing point of the first dielectric film as expressed by Celsius indication.

3. A method of fabricating a semiconductor integrated circuit device according to claim 1, wherein the ashing treatment is conducted at a temperature on the upper surface of the substrate of 40% or higher for the curie point or the crystallizing annealing point of the first dielectric film as expressed by Celsius indication.

4. A method of fabricating a semiconductor integrated circuit device according to claim 1, wherein the ashing treatment is conducted at a temperature on the upper surface of the substrate of 2/3 or higher for the curie point or the crystallizing annealing point of the first dielectric film as expressed by Celsius indication.

5. A method of fabricating a semiconductor integrated circuit device according to claim 1, wherein the first wiring pattern comprises a conductive film having a titanium compound or aluminum as a main ingredient.

6. A method of fabricating a semiconductor integrated circuit device according to claim 1, wherein the first dielectric film comprises a film having a PZT, PLZT or BST as a main ingredient.

7. A method of fabricating a semiconductor integrated circuit device according to claim 2, wherein the first wiring pattern comprises a conductive film containing titanium nitride as a main ingredient.

8. A method of fabricating a semiconductor integrated circuit device according to claim 2, wherein a plasma density in the dry etching is $1.0 \times 10^{11}$ cm$^{-3}$ or less.

9. A method of fabricating a semiconductor integrated circuit device according to claim 2, wherein the ashing treatment is conducted in an oxidative atmosphere containing steams.

10. A method of fabricating a semiconductor integrated circuit device according to claim 9, wherein the ashing treatment is conducted in an oxidative atmosphere containing $CF_4$.

11. A method for fabricating a semiconductor integrated circuit device comprising the steps of:

(a) forming a first dielectric film comprising a highly dielectric material or a ferroelectric material having a perovskite structure on a first main surface of a substrate for use in fabrication of an integrated circuit;

(b) forming a first conductive layer on the first main surface of the substrate on which the first dielectric film is formed;

(c) forming a first photoresist film pattern on the first main surface of the substrate on which the first conductive layer is formed;

(d) forming a first wiring pattern on the first main surface of the substrate by applying a dry etching treatment to the first main surface of the substrate on which the first photoresist film pattern is formed; and (e) removing the first photoresist film pattern on the first main surface of the substrate by applying an ashing treatment at a temperature on the upper surface of the substrate of 1/3 or higher for the curie point or the crystallizing annealing point of the first dielectric film as expressed by Celsius indication.

12. A method of fabricating a semiconductor integrated circuit device according to claim 11, wherein the ashing treatment is conducted at a temperature on the upper surface of the substrate of 40% or higher for the curie point or the crystallizing annealing point of the first dielectric film as expressed by Celsius indication.

13. A method of fabricating a semiconductor integrated circuit device according to claim 11, wherein the ashing treatment is conducted at a temperature on the upper surface of the substrate of 2/3 or higher for the curie point or the crystallizing annealing point of the first dielectric film as expressed by Celsius indication.

14. A method of fabricating a semiconductor integrated circuit device according to claim 13, wherein the dry etching treatment is conducted by inducely coupled plasma.

15. A method of fabricating a semiconductor integrated circuit device according to claim 14, wherein the first wiring pattern comprises a conductive film having a titanium compound or aluminum as a main ingredient.

16. A method of fabricating a semiconductor integrated circuit device according to claim 15, wherein the first wiring pattern comprises a film containing a PZT, PLZT or BST as a main ingredient.

17. A method of fabricating a semiconductor integrated circuit device according to claim 16, wherein the dry etching treatment is conducted by applying a dry etching treatment by plasma excitation with no substantial presence of static or quasi-static magnetic field component on the first main surface of the substrate.

18. A method of fabricating a semiconductor integrated circuit device according to claim 17, wherein the first wiring pattern comprises a conductive film containing titanium nitride as a main ingredient.

19. A method of fabricating a semiconductor integrated circuit device according to claim 15, wherein a plasma density in the dry etching is $1.0 \times 10^{11}$ cm$^{-3}$ or less.

20. A method of fabricating a semiconductor integrated circuit device according to claim 19, wherein the ashing treatment is conducted in an oxidative atmosphere containing steams.

* * * * *